United States Patent
Basol et al.

(10) Patent No.: US 7,503,830 B2
(45) Date of Patent: Mar. 17, 2009

(54) APPARATUS FOR REDUCTION OF DEFECTS IN WET PROCESSED LAYERS

(75) Inventors: Bulent M. Basol, Manhattan Beach, CA (US); Cyprian E. Uzoh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 76 days.

(21) Appl. No.: 11/704,631

(22) Filed: Feb. 9, 2007

(65) Prior Publication Data

US 2007/0135022 A1    Jun. 14, 2007

Related U.S. Application Data

(62) Division of application No. 10/425,782, filed on Apr. 29, 2003, now Pat. No. 7,189,146.

(60) Provisional application No. 60/458,812, filed on Mar. 27, 2003.

(51) Int. Cl.
    *B24B 49/00*    (2006.01)
(52) U.S. Cl. .................... 451/5; 451/60; 205/99
(58) Field of Classification Search ............ 96/4, 96/6, 46, 258; 210/94; 205/99; 451/5, 60
    See application file for complete search history.

(56) References Cited

U.S. PATENT DOCUMENTS

| | | | |
|---|---|---|---|
| 3,276,983 A | 10/1966 | Dolan et al. |
| 3,616,599 A | 11/1971 | Burnham, Sr. |
| 4,081,347 A | 3/1978 | Becker |
| 4,130,706 A | 12/1978 | Plambeck, Jr. |
| 5,383,483 A | 1/1995 | Shibano |
| 5,695,545 A | 12/1997 | Cho et al. |
| 5,762,684 A | 6/1998 | Hayashi et al. |
| 5,788,742 A | 8/1998 | Sugimoto et al. |
| 6,110,345 A | 8/2000 | Iacoponi |
| 6,113,769 A | 9/2000 | Uzoh et al. |
| 6,146,517 A | 11/2000 | Hoinkis |
| 6,171,367 B1 | 1/2001 | Peng et al. |
| 6,241,585 B1 | 6/2001 | White |
| 6,254,760 B1 | 7/2001 | Shen et al. |
| 6,267,853 B1 | 7/2001 | Dordi et al. |
| 6,328,785 B1 | 12/2001 | Hayashi |

(Continued)

FOREIGN PATENT DOCUMENTS

DE    24 15 573 A    10/1975

(Continued)

OTHER PUBLICATIONS

Shannon et al., "Copper interconnects for high-volume manufacturing", *Semiconductor International*, May 2001.

*Primary Examiner*—Maurina Rachuba
(74) *Attorney, Agent, or Firm*—Knobbe Martens Olson & Bear LLP

(57) ABSTRACT

The present invention provides an apparatus for wet processing of a conductive layer using a degassed process solution such as a degassed electrochemical deposition solution, a degassed electrochemical polishing solution, a degassed deposition solution, and a degassed cleaning solution. The technique includes degassing the process solution before delivering the degassed process solution to a processing unit or degassing the process solution in situ, within the processing unit.

10 Claims, 7 Drawing Sheets

U.S. PATENT DOCUMENTS

| | | |
|---|---|---|
| 6,328,871 B1 | 12/2001 | Ding et al. |
| 6,331,237 B1 | 12/2001 | Andricacos et al. |
| 2001/0052465 A1 | 12/2001 | Dordi et al. |
| 2004/0026255 A1 | 2/2004 | Kovarsky et al. |
| 2004/0060436 A1 | 4/2004 | Parekh et al. |

FOREIGN PATENT DOCUMENTS

| | | |
|---|---|---|
| EP | 0 901 153 A2 | 3/1999 |
| FR | 2 416 958 A | 9/1979 |
| JP | 61-12877 | 1/1986 |
| JP | 2001-196728 | 7/2001 |
| WO | WO 00/75402 A1 | 12/2000 |

APPARATUS FOR REDUCTION OF DEFECTS IN WET PROCESSED LAYERS

RELATED APPLICATIONS

This application is a divisional of and claims priority to U.S. patent application Ser. No. 10/425,782, filed Apr. 29, 2003 now U.S. Pat. No. 7,189,146, which is a non-provisional of and claims priority to U.S. provisional application No. 60/458,812, filed Mar. 27, 2003. The disclosures of the foregoing applications are hereby incorporated by reference in their entireties.

FIELD

The present invention relates to manufacture of semiconductor integrated circuits and, more particularly to a method for electrochemical deposition or polishing of conductive layers.

BACKGROUND

Conventional semiconductor devices generally include a semiconductor substrate, such as a silicon substrate, and a plurality of sequentially formed dielectric interlayers such as silicon dioxide and conductive paths or interconnects made of conductive materials. Copper and copper-alloys have recently received considerable attention as interconnect materials because of their superior electro-migration and low resistivity characteristics. The interconnects are usually formed by filling copper in features or cavities etched into the dielectric layers by a metallization process. The preferred method of copper metallization is electroplating. In an integrated circuit, multiple levels of interconnect networks laterally extend with respect to the substrate surface. Interconnects formed in sequential layers can be electrically connected using vias.

In a typical process, first an insulating layer is formed on the semiconductor substrate. Patterning and etching processes are performed to form features or cavities such as trenches and vias in the insulating layer. Then, a barrier/glue layer and a seed layer are deposited over the patterned surface and a conductor such as copper is electroplated to fill all the features. However, the plating process, in addition to filling the features with copper, also deposits excess copper over the top surface of the substrate. This excess copper is called an "overburden" and needs to be removed during a subsequent process step. In standard plating processes this overburden copper has a large topography since the Electrochemical Deposition (ECD) process coats large features on the wafer in a conformal manner. Conventionally, after the copper plating, Chemical Mechanical Polishing (CMP) process is employed to first globally planarize this topographic surface and then to reduce the thickness of the overburden copper layer down to the level of the surface of the barrier layer, which is also later removed leaving conductors only in the cavities.

During the copper electrodeposition process, specially formulated plating solutions or electrolytes are used. An exemplary electrolyte contains water, acid (such as sulfuric acid), ionic species of copper, chloride ions and certain additives, which affect the properties and the plating behavior of the deposited material. Typical electroplating baths contain at least two of the three types of commercially available additives such as accelerators, suppressors and levelers.

Electroplating solutions such as the commonly used copper sulfate solutions employed for copper film deposition naturally contain dissolved air since they are in contact with air. While in use in plating tools these electrolytes may further get saturated with air since they are often cycled between the plating cell and an electrolyte tank. After being used in the plating cell for plating copper onto the workpiece surface, electrolyte is recycled by directing it back to the main tank, and after filtration and chemical composition adjustment, it is pumped back into the plating cell. Such recycling minimizes electrolyte waste, however, at the same time it increases air dissolution into the electrolyte. In some prior art approaches, a nitrogen blanket has been used over the electrolyte tank and other parts of the system to minimize exposure of electrolyte surface to air. There have also been methods that involved bubbling nitrogen through the electrolyte to reduce oxygen content in the solution. Such efforts may understandably reduce the concentration of dissolved oxygen in the electrolyte, however they do not reduce the total dissolved gas content of the solution. In fact, such approaches are expected to enhance the dissolution of the blanket gas, such as nitrogen, in the electrolyte. In other words, gas content in the electrolyte would still be high, although its chemical composition would be different, i.e., there would be more nitrogen gas and less oxygen.

Dissolved gas in plating electrolytes creates several problems. First of all, dissolved gas in any liquid causes initiation and growth of bubbles on surfaces touching the liquid. For example, when a workpiece, such as a semiconductor wafer is immersed into a copper-plating electrolyte with dissolved air in it, micro-bubbles of gas often spontaneously initiate on the surface of the wafer. Initiation and growth rate of such micro-bubbles are expected to be a function of the degree of saturation of the liquid by the gas, the temperature of the electrolyte and the pressure. Highly agitated electrolytes in the presence of a gas, such as air, get highly saturated with air and therefore bubbles form on surfaces touching such electrolytes very easily. Similarly, higher temperatures would promote growth of bubbles faster. Electrolytes pumped from high pressure zones to lower pressure zones would have the dissolved gas more unstable in the low pressure zone, i.e., bubble formation would be promoted in zones where fluid pressure is suddenly reduced (such as after a flow restricting filter). FIGS. 1A, 1B, 1C and 1D schematically depict one of the consequences of such bubble formation.

In FIG. 1A, a silicon substrate 10 is shown with sub-micron size features 12 such as trenches etched into an insulating layer 14 on its surface. The etched features 12 and the top surface 13 are lined with a barrier layer 16 and a copper seed layer 17. As illustrated in FIG. 1B, the substrate 10 is then placed into a copper plating solution 18 for copper deposition. FIG. 1B represents the instant when the substrate 10 is immersed into the plating solution 18, which is saturated with air or has a large concentration of dissolved gas. The plating is initiated by applying a potential between the conductive substrate surface (barrier layer 16 and/or seed layer 17) and an electrode (not shown) in the plating solution 18. Bubbles 20 represent the micro-bubbles that may initiate on the surface of the seed layer as soon as the wafer is placed in the solution. These bubbles may be micron or sub-micron in size and, they may be within the features 12, on the seed layer portion covering the top surface 13 or at the corners 21. As the plating continues, bubbles 20 retard material deposition onto the locations that they are attached and give rise to defects such as voids as depicted in FIG. 1C. Also shown in FIG. 1C is the possibility of having new bubbles 22 nucleate on surface 24 of the copper layer 26, which is being deposited. FIG. 1D shows the substrate 10 after the copper deposition step is finished. As can be seen in FIG. 1D, various defects 28 are created by the bubbles on the substrate surface either during the initial or later stages of the electrodeposition process. These defects, after the CMP and other process steps employed to fabricate the interconnect structure, cause reliability problems such as poor stress migration and poor electromigration. It should be noted that similar problems with bubbles are present for deposition of copper layers by the electroless deposition techniques.

Formation of bubbles of gas on surfaces placed in plating electrolytes can cause other problems also. Even if bubbles are not formed on the wafer surface, they can form on other surfaces of the plating cell and then migrate to the wafer surface, giving rise to defects already described. In certain wet processing techniques, (such as electrochemical mechanical deposition and electrochemical mechanical polishing) there are pad structures or workpiece surface influencing device (WSID) structures proximate to the wafer surface. These pad structures are used to sweep the wafer surface during the electrochemical mechanical process to planarize or polish the wafer surface. The surfaces of all these structures, which are immersed in the process solutions and placed close to the wafer surface, are also possible sites for bubbles to initiate, grow and eventually migrate to the wafer surface causing defects.

SUMMARY

The problems described above can be resolved by using a degassed process solution or process electrolyte of the present invention. Degassing reduces dissolved gas content in the process solution and reduces the driving force for bubble formation on surfaces exposed to the degassed electrolyte.

In one aspect of the present invention, a method of wet processing of a layer on a workpiece surface is provided. The method includes degassing a process solution to form a degassed process solution and processing of the surface of the layer using the degassed process solution. The wet process can be a cleaning process, an electrochemical process, an electrochemical mechanical process, a chemical process, a chemical mechanical process or any combination thereof.

According to another aspect of the present invention, the step of degassing is an in-situ degassing where degassing can be performed within a process station.

In another aspect of the present invention, degassing reduces dissolved gas content in the process solution. The degassing lowers dissolved oxygen content and reduces consumption of organic additives during the step of processing.

In yet another aspect of the present invention, a method of depositing a layer on a workpiece surface is provided. The method includes supplying a process solution to a degasser, degassing the process solution using the degasser to form a degassed process solution, delivering the degassed process solution to a processing unit, wetting the workpiece surface with the degassed process solution, and depositing the layer. The step of depositing includes at least one of electrochemical deposition, electrochemical mechanical deposition, and electroless deposition.

According to another aspect of the present invention, the workpiece surface includes a seed layer having a thickness less than 1000 Å and the step of degassing the process solution reduces an amount of dissolved gases in the process solution, thereby reducing a chemical interaction between the degassed process solution and the seed layer after the step of wetting and prior to the step of depositing.

In another aspect of the present invention, an apparatus for processing a surface of a workpiece using degassed process solution is provided. The apparatus comprises a solution tank configured to hold process solution, a degasser coupled to the solution tank configured to degas the process solution, and at least one process station coupled to the degasser configured to receive the degassed process solution for processing the surface of the workpiece.

In yet another aspect of the present invention, the apparatus includes a monitor unit coupled to the degasser and configured to maintain a dissolved gas content in the degassed process solution at or below a predetermined amount. The monitor unit may be a dissolved gas meter for measuring the dissolved gas content.

In another aspect of the present invention, degassing, as applied to electrochemical process solutions or electro less deposition process solutions that contain additives, decreases the amount of oxygen in the solutions and thus increases the life-time of such additives.

In another aspect of the present invention degassing as applied to the deposition solutions reduces the resistance of films deposited from such degassed solutions.

In yet another aspect of the present invention use of a degassed process solution reduces the chemical reaction between the process solution and a thin layer on the surface of the workpiece that is immersed into the process solution.

An apparatus and method for processing a surface of a layer on a workpiece are provided by degassing a process solution to form degassed process solution and processing the surface of the layer using the degassed process solution. The degassed process solution reduces bubble formation, defects on the surface of the layer, increases the life-time of additives used during processing, and getters additional bubbles that may be generated during processing.

Other aspects and, advantages of the present invention can be seen upon review of the figures, the detailed description, and the claims which follow.

DETAILED DESCRIPTION

Figure 6:
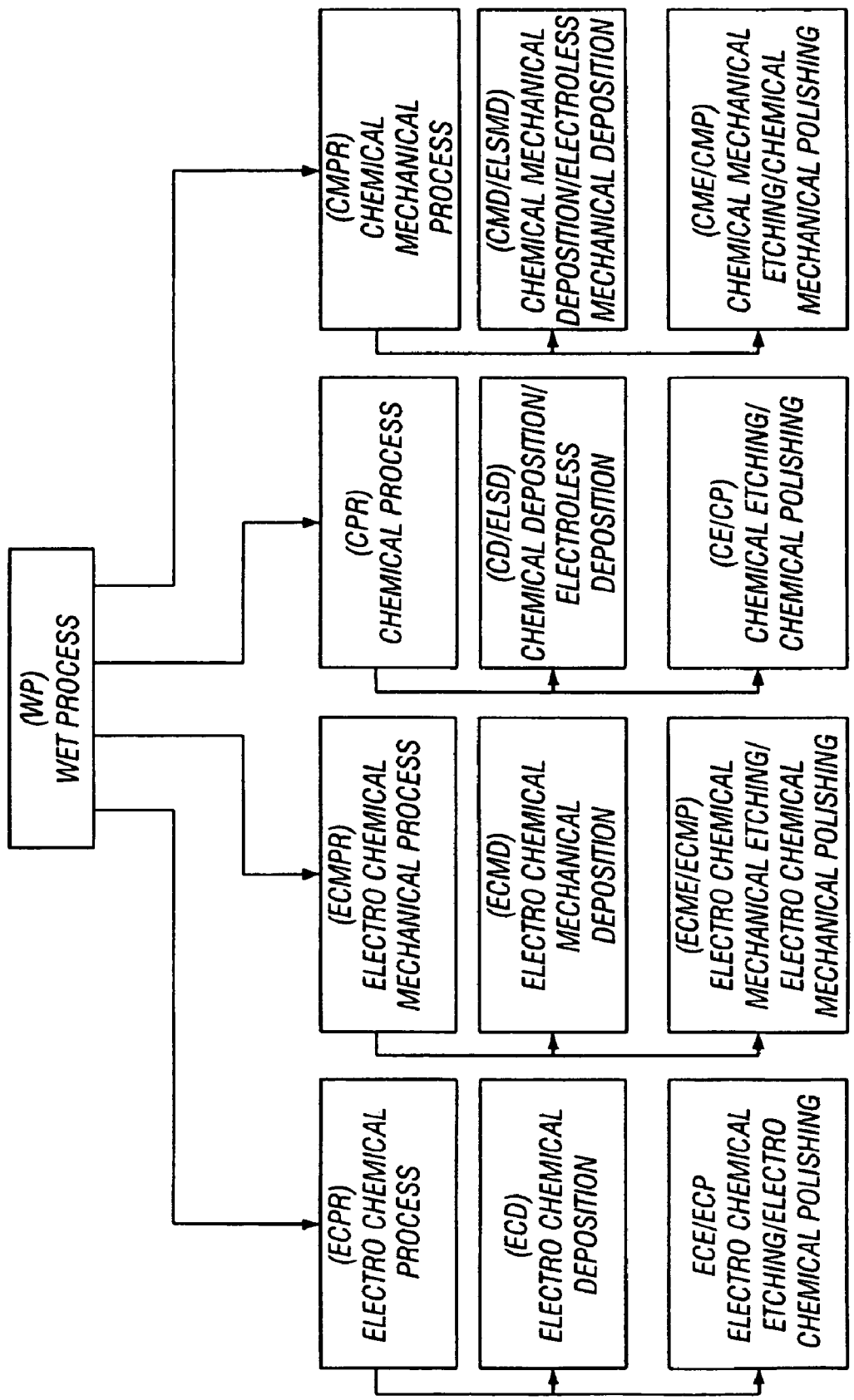
FIG. 6 shows a list of processes according to embodiments of the present invention.

FIG. 6 defines and provides a list of wet process approaches that can use various aspects of the present invention. As shown in FIG. 6, Wet Processes (WP) may be used for depositing materials on a workpiece surface or removing materials from a workpiece surface. Wet Processes comprise Electrochemical Process (ECPR), Electrochemical Mechanical Process (ECMPR), Chemical Process (CPR) and Chemical Mechanical Process (CMPR). ECPR includes Electrochemical Deposition (ECD), which is used to deposit materials and Electrochemical Etching/Electrochemical Polishing (ECE/ECP), which is used to remove materials, both techniques utilizing electrochemical means. ECMPR includes Electrochemical Mechanical Deposition (ECMD), which is used to deposit materials while physically contacting the deposited surface, and Electrochemical Mechanical Etching/Electrochemical Mechanical Polishing (ECME/ECMP), which is used to remove materials from surfaces while the surfaces are physically contacted. CPR comprises Chemical Deposition/Electroless Deposition (CD/ELSD), which deposits materials onto workpiece surface without applying any external potential to the workpiece surface, and Chemical Etching/Chemical Polishing (CE/CP), which is used to chemically remove materials from the workpiece surface again without application of any external voltage. CMPR includes a well-known material removal and planarization process, Chemical Mechanical Etching/Chemical Mechanical Polishing (CME/CMP). A novel method Chemical Mechanical Deposition/Electroless Mechanical Deposition (CMD/ELSMD) involves depositing materials without application of external potential just like CD/ELSD) while physically contacting the deposited surface.

The above processes are described in a number of exemplary patents and papers given below. For example, a detailed description of ECD is found in the book entitled Modern Electroplating by Schlesinger, M. et al., eds., 2000, $4^{th}$ Ed., John Wiley & Sons, N.Y, and a detailed description of the ECE/ECP can be found in the article entitled Copper Electropolishing in Concentrated Phosphoric Acid by Vidal, R. and West, A. C., J. Electrochem Soc., Vol. 142, No. 8, August 1995, page 2682.

A description of ECMD is found in U.S. Pat. No. 6,126,992 entitled Method and Apparatus for Electrochemical Mechanical Deposition, U.S. Pat. No. 6,534,116 entitled Plating Method and Apparatus that Creates a Differential Between Additive Disposed on a Top Surface and a Cavity Surface of a Workpiece Using an External Influence, and also, in the article entitled Electrochemical Mechanical Deposition (ECMD) technique for Semiconductor Interconnect Applications, by Basol, B. M., Uzoh, C. E., Talieh, H., Young, D. Lindquist, P., Wang, T and Cornejo, M., Microelectronic Engineering, vol. 64 (2002), pp. 43-51. A description of ECME/ECMP is found in the above-mentioned U.S. Pat. No. 6,126,992.

CD/ELSD is described in the book entitled Electroless Metal Plating, by McDonald, I., April 1988, Van Nostrand Reinhold. CE/CP is described in U.S. Pat. No. 5,486,234, entitled Removal of Field and Embedded Metal by Spin Spray Etching. CMD/ELSMD is described in above given U.S. Pat. No. 6,534,116 and a description of CME/CMP is found in the book entitled Chemical Mechanical Polishing 2001-Advances and Future Challenges by Babu, S. V et al., eds., 2001, Materials Research Society Symposium Proceedings, Vol. 671.

Problems associated with dissolved gasses in process solutions and more specifically bubbles generated in such process solutions can be resolved by using a degassed process solution or process electrolyte. Degassing process reduces dissolved gas content in the solution and drastically reduces bubble formation on surfaces exposed to the degassed electrolyte. Use of degassed electrolytes in a wet deposition system, such as a system performing electrochemical deposition (ECD), electrochemical mechanical deposition (ECMD), chemical deposition (CD) or chemical mechanical deposition (CMD), reduces initiation of micro or nano-size bubbles on the surface of the workpiece or wafer, reducing defects. Similarly, use of such electrolytes minimizes or eliminates bubble initiation on other surfaces touching the electrolyte so that the possibility of these bubbles migrating to the wafer surface and causing problems is drastically reduced. Degassed electrolytes, in addition to reducing the formation of micro-bubbles, also reduce the rate of growth of any micro-bubbles that may have nucleated on surfaces that are wetted by such solutions. Use of degassed electrolytes in wet deposition processes has some other advantages also. These advantages will be described using an exemplary electrochemical mechanical deposition system. It should be understood, however, that these advantages are also applicable to electrochemical deposition, and chemical deposition. They are further applicable to wet removal techniques of chemical polishing, electrochemical mechanical polishing, electrochemical polishing and chemical mechanical polishing processes. In general we can state that the present invention is applicable to wet processes using a process solution.

Degassing of the plating electrolyte used in an ECD, ECMD, CD or CMD process reduces the oxygen content of the plating electrolyte since one of the dissolved gasses in the plating electrolyte is oxygen. Reduced oxygen content in the electrolyte, on the other hand, reduces oxidation of the organic additives (such as brighteners or accelerators, suppressors, levelers etc), which are commonly included in the formulation of such solutions. Reduction of oxidation, in turn, extends the lifetime of organic additives and reduces overall process cost. It should be noted that organic additives, once oxidized, loose their ability to provide good properties to the deposited layer and thus need to be replenished.

As indicated above, degassing process reduces the oxygen content of the process solution. If the process solution is a deposition solution, such as a copper electrochemical deposition solution or a copper electroless deposition solution, films grown using such degassed electrolytes are expected to contain less oxygen. Reduction of oxygen impurity in the deposited layer, such as a copper layer, on the other hand, increases its grain size, especially after the layer is annealed. Less oxide in the copper layer and larger grain size reduce its electrical resistivity, which is very important in electronics applications, such as interconnect applications. It should be noted that annealing of deposited layers may be carried out at elevated temperatures or at room temperature (self-annealing).

Large grain size and low electrical resistivity are good properties for copper films used in interconnect applications since such films are more reliable, more stable and cause less time delay in the circuits. Further, lower micro-void density in films grown out of degassed solutions makes them more attractive for interconnect applications. Lower micro-void density offers better stress migration and electromigration properties, which are extremely important for interconnect materials.

Further, it is known that process solutions may chemically interact with seed layers at the beginning of a wet deposition process such as an electrochemical deposition process. Thin copper seed layers, for example, are chemically attacked and may be damaged by the process solutions when the work piece is first introduced into the process solution. Hot entry is one way of avoiding this unwanted interaction between the process solution and the seed layer, when wafers with very thin seed layers such as less than 1000 Å, are immersed into the process solution for electroplating. During hot-entry, a voltage is applied to the seed layer before it is wetted by the process solution. This cathodic voltage protects the seed layer against chemical dissolution. However, hot entry has some drawbacks, such as formation of hot spots, which are high current density locations (therefore high deposition locations) on the wafer where the solution makes the first physical contact with the seed layer. In this respect cold entry, i.e., entry of the substrate into the solution with zero applied potential, is preferred. However, as indicated above, weak seed layers, i.e., thin or oxidized seed layers, get chemically attacked by the process solution upon cold entry. A degassed electrolyte has reduced oxygen content and less oxidizing property. Therefore, its chemical etching strength is also reduced. Cold entry into degassed electrolytes may be used even for weak seed layers without damaging the seed layer. Electroless deposition processes for materials such as copper can also benefit from this aspect of the invention since degassing of electroless deposition solutions would also reduce their chemical reaction with thin layers on workpiece surfaces. Some of the benefits of the present invention will now be described more in details using examples of wet processes.

Figure 1A:
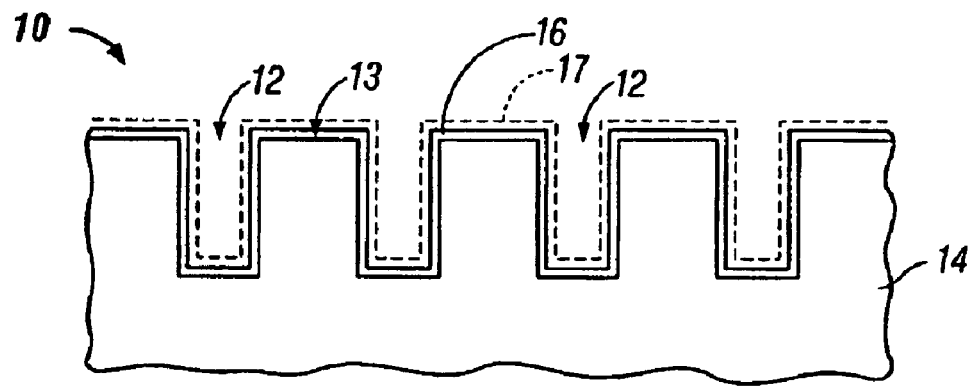
FIG. 1A is a schematic illustration of a semiconductor substrate having features to be filled with a copper layer.
Figure 1B:
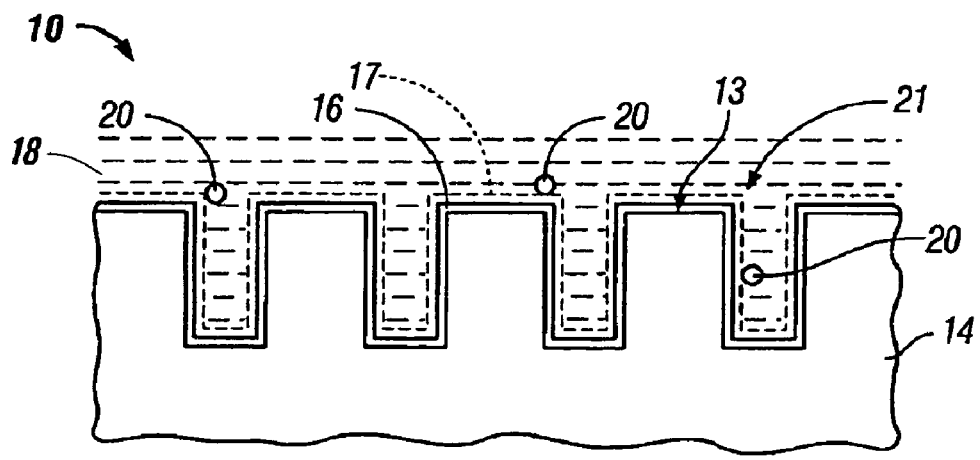
FIG. 1B is a schematic illustration of the formation of the micro bubbles on seed layer of the substrate shown in FIG. 1A.
Figure 1C:
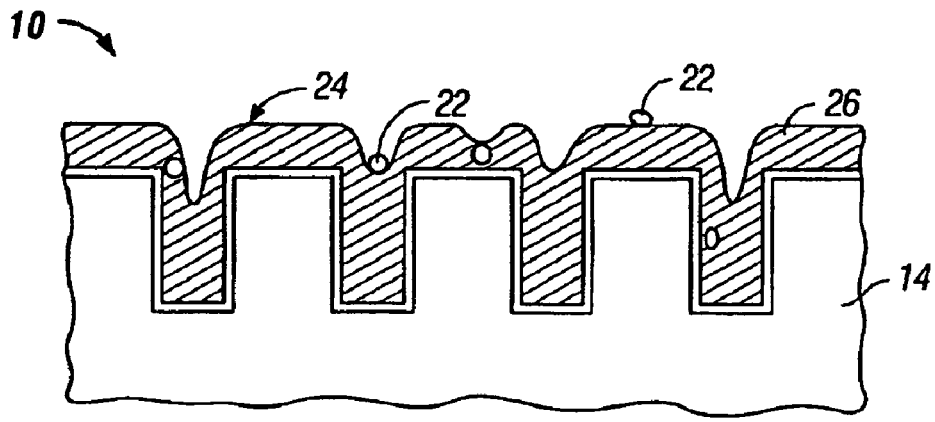
FIG. 1C is a schematic illustration of the substrate shown in FIG. 1B during electroplating a copper layer on top of it, wherein the copper layer has defects caused by bubbles.
Figure 1D:
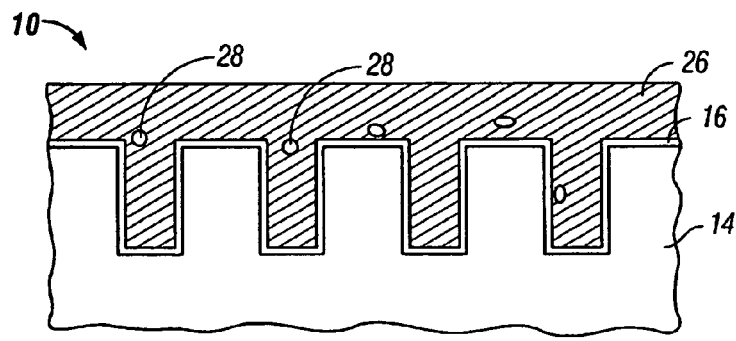
FIG. 1D is a schematic illustration of the substrate shown in FIG. 1C after forming a planar copper layer.
Figure 2A:
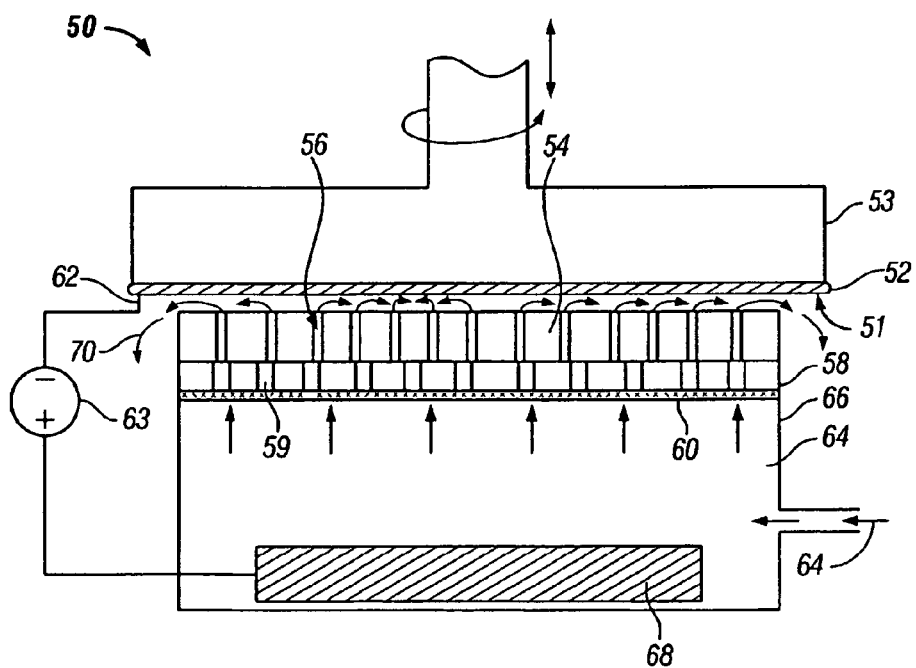
FIG. 2A is a schematic illustration of an electrochemical mechanical processing system.

FIG. 2A shows an electrochemical mechanical processing system 50 during processing of a surface 51 of a wafer 52, which is held by a wafer carrier 53. The system 50 may be used for electrochemical deposition, electrochemical mechanical deposition, electrochemical polishing or electrochemical mechanical polishing.

Process solutions used for wet processes can be the same or different solutions. For example, electrochemical deposition solution may be used for electrochemical mechanical deposition process also. Electrochemical polishing solution may also be used in an electrochemical mechanical polishing process. Chemical mechanical polishing (CMP) solutions may be used in electrochemical mechanical polishing processes. Moreover, those skilled in the art will understand that all these process solutions may be modified to optimize process results from each type of process.

The carrier head in FIG. 2A can rotate, move vertically (z-motion) and laterally (x or y motions). System 50 includes a pad 54 having openings 56. The pad 54 is supported by a perforated support structure 58 having openings 59. A filter 60 is placed under the support structure or between the support structure and the pad. As shown in FIG. 2A, the width and length of the pad 54 may be such designed that the width of the pad may be shorter than the diameter of the wafer. The length of the pad 54 may be longer than the diameter of the wafer. Electrical contacts 62 may touch the edge of the wafer and connect the surface 51 to a terminal of a power supply 63. A process solution 64, which is contained in a chamber 66, is delivered to the space between the filter 60 and an electrode 68. The electrode 68 is connected to a terminal of the power supply. During a deposition process, the electrode is an anode and is connected to the positive terminal of the power supply while the surface of the wafer is negatively polarized by the other terminal of the power supply. During material removal processes, however, the electrode is polarized negatively while the wafer surface is polarized positively. The solution passes through the filter, the openings in the support structure as well as the pad, and wets the surface of the wafer. The process solution is delivered to the chamber 66 through a solution inlet 64 from a process solution tank (not shown). The used process solution 70 leaves the chamber from an upper edge of the chamber 66 for recycling. The process solution may be an electroplating solution for electrochemical deposition or electrochemical mechanical deposition processes, and an electropolishing or electroetching solution for the electrochemical polishing or electrochemical mechanical polishing processes.

Figure 2B:
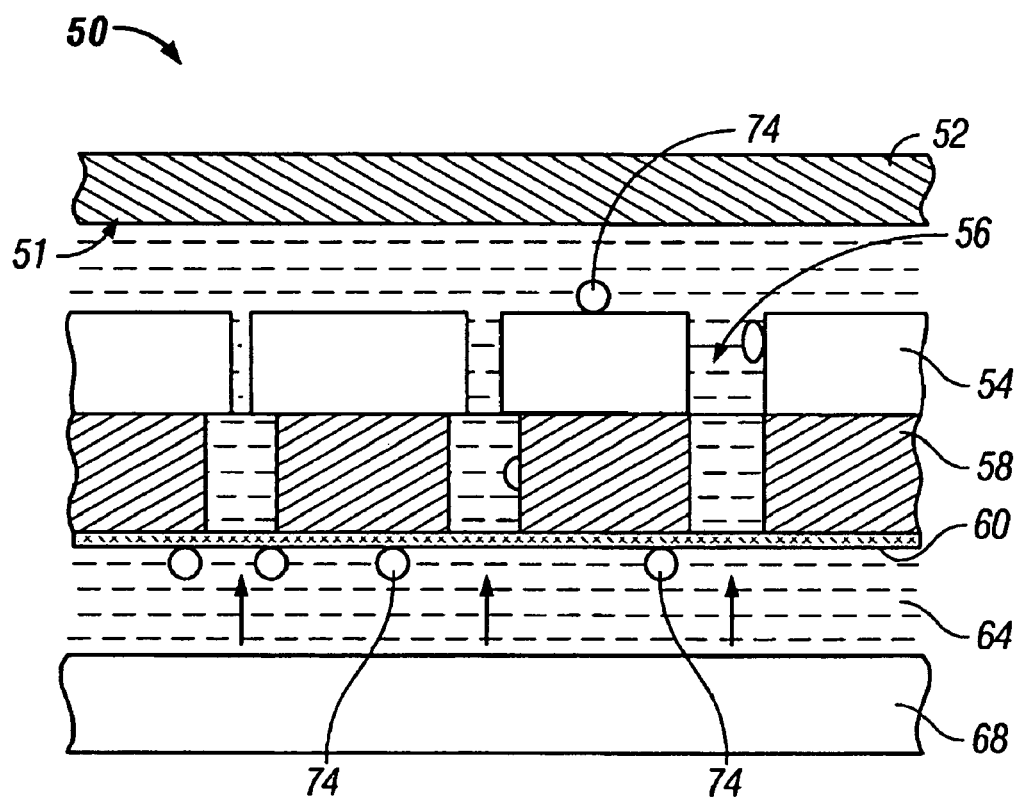
FIG. 2B is a schematic illustration of various trapped bubbles in the system shown in FIG. 2A.

As shown in FIG. 2B in partial view, there may be bubbles 74 accumulating under the filter 60 or within the support structure 58 and on the pad 54, in such systems. These bubbles may originate from the dissolved gas in the electrolyte or can come from other sources in the circulation system. For example, the bubbles 74 under the filter 60 can come from the pump and the lines that bring the electrolyte into the processing cell. Such bubbles, in electrolytes that are saturated with gas would be stable and they can even grow in time since the dissolved gas in the electrolyte can keep nucleating on them. This then, results in blocking of the filter 60 locally and thereby reduces flow of the process solution and also distorts the electric field distribution to the wafer surface at that location. Similarly, presence of bubbles within the openings in the pad or the support structure interferes with electrical field flow during electrochemical deposition or electrochemical polishing distorting deposition or removal rate at that location. As a result, the uniformity of the processed surface gets worse.

Use of a degassed electrolyte reduces or eliminates such bubble formation as described before. However, even if some bubbles are created at another location by another source (such as the pump or other elements of the system) and sent to the area under the filter 59, the bubbles would not be stable and would not grow in time in a degassed solution. Since the gas content in a degassed electrolyte is low, the electrolyte itself getters bubbles, i.e., acts as a getter for such bubbles. In other words, the driving force for gas dissolution in a liquid, such as our exemplary degassed electrolyte, increases as the gas content in the electrolyte decreases. Therefore, any bubbles generated in the system by any source tend to dissolve into the degassed electrolyte more readily than a regular electrolyte with high gas content. The bubbles, instead of growing in time, would reduce in size and would eventually be eliminated in a degassed solution. The dissolved gas due to the dissolution of these bubbles in the electrolyte, in turn, would be taken out of the electrolyte by the degasser. Application of this principle can be seen in the following exemplary systems, which use degassed process solutions.

Figure 3:
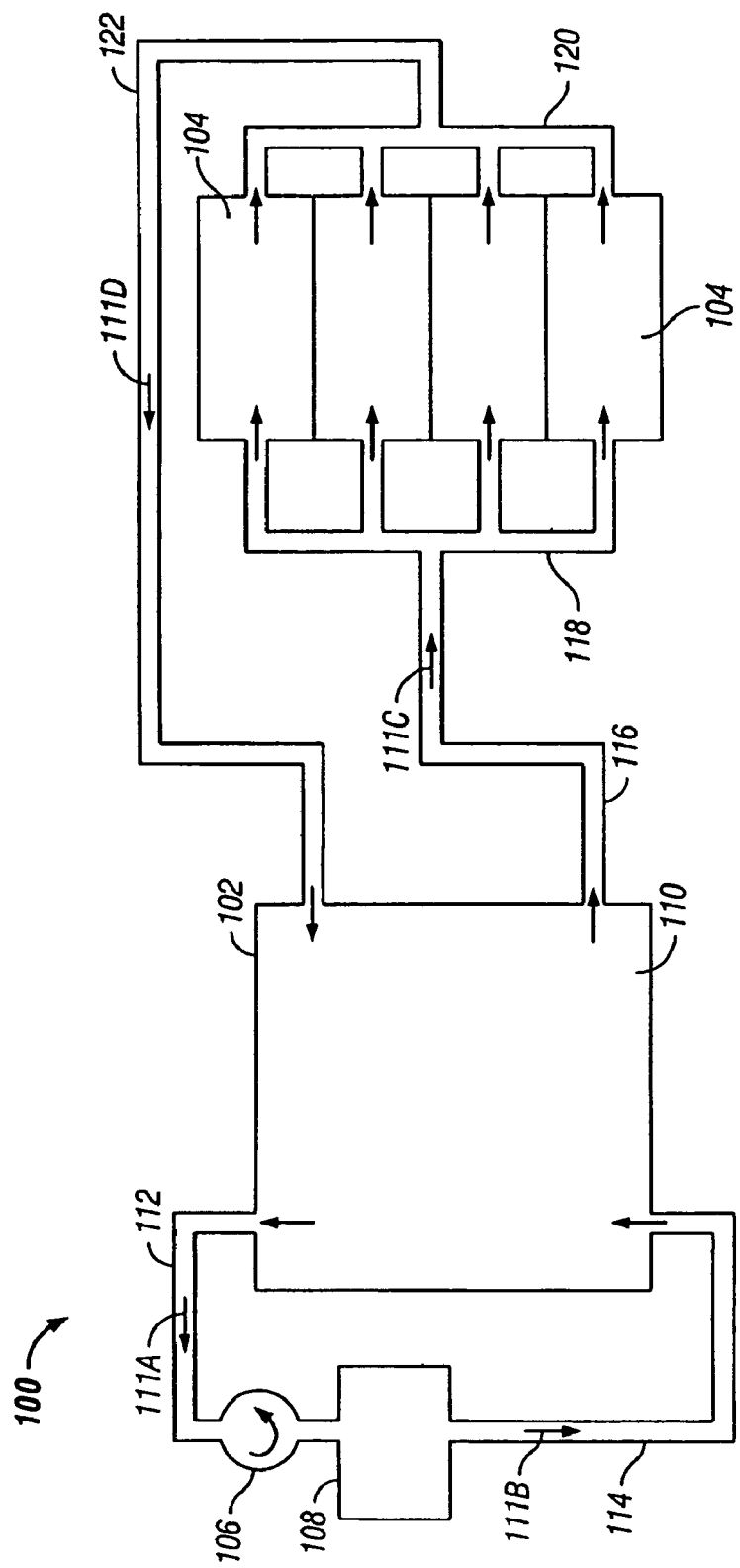
FIG. 3 is a schematic illustration of an embodiment of a system of the present invention including a degasser.

As shown in FIG. 3, a processing system 100 may comprise a solution tank 102 that is connected to a wet processing unit comprising a number of wet processing stations 104. The wet processing stations in FIGS. 3 and 4 may be electrochemical process stations, electrochemical mechanical process stations, chemical process stations, chemical mechanical process stations, or any combination thereof. Solution tank 102 is also connected to a pump 106 and a degasser 108. In this embodiment, a process solution 110 in the solution tank undergoes two cycling operations. In a first cycling operation, the pump 106 delivers the solution 110 in the tank to the degasser through a first line 112 with a first solution flow 111A. The process solution 110 is degassed in the degasser 108 and delivered to a second line 114 with a second solution flow 111B. The second line 114 delivers the process solution in second solution flow 111B, which is degassed, back to the solution tank 102. This cycle is either continuous or intermittent. In other words, degassing may be carried out either continuously or only part of the time.

Figure 4:
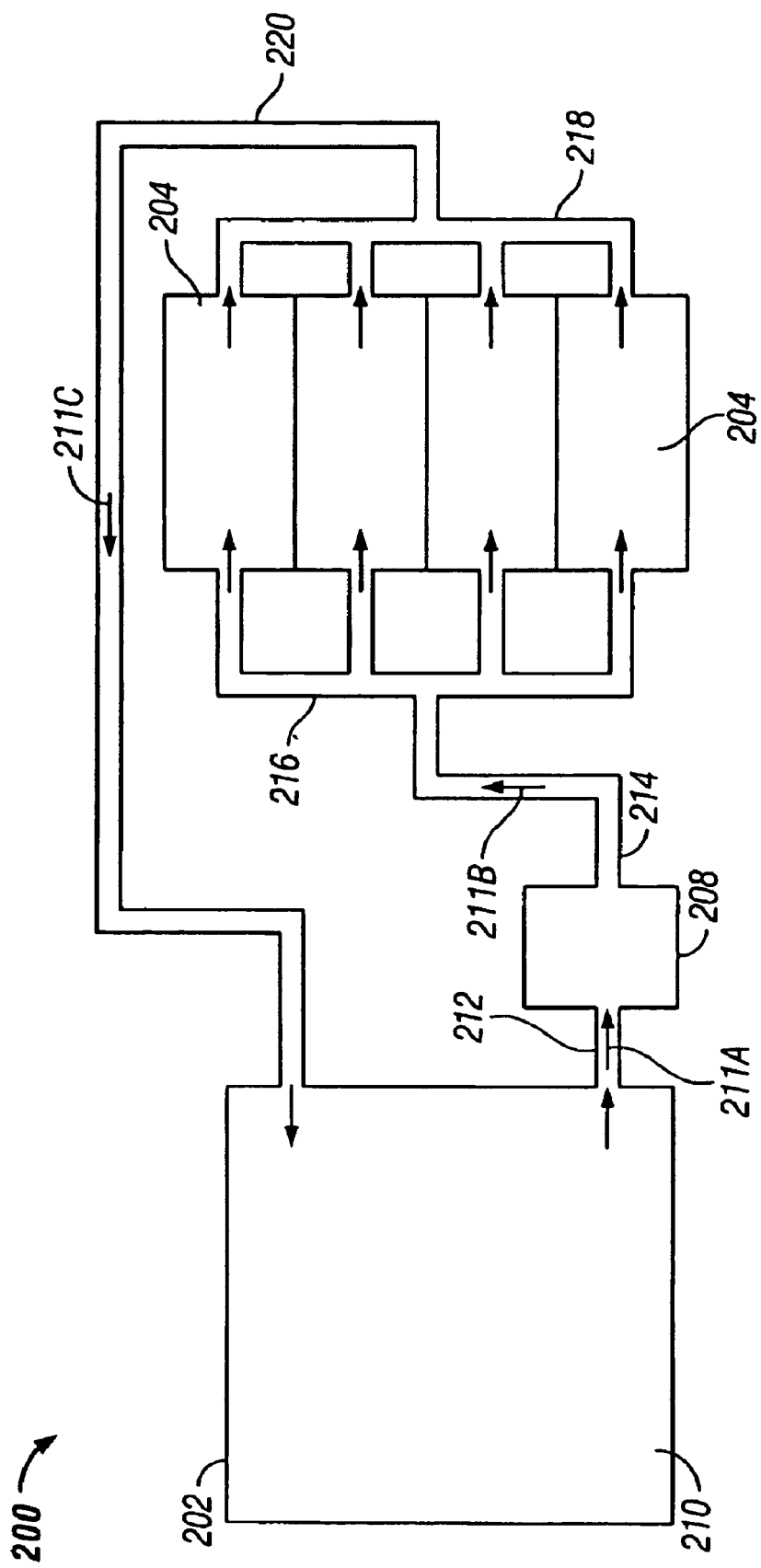
FIG. 4 is a schematic illustration of another embodiment of a system of the present invention including a degasser.

In a second cycling operation, through a third line 116, the process solution 110 is delivered to the wet processing stations 104 with a third solution flow 111 C. The delivery may be performed through an intake manifold 118 connecting the line 116 to each process station 104. The intake manifold 118 may include valves (not shown) to switch on and off the third solution flow 111C to each station. Used process solution from each station is received by a solution exit manifold 120 and is delivered to a fourth line 122 as a fourth solution flow 111D. The fourth line 122 delivers the fourth solution flow 111D, which is the used process solution, back to the process solution tank where additives may be added to replenish the process solution and to degas it. Alternatively, the replenishment may be done in a replenishment tank (not shown). In this case, the fourth solution flow may be first delivered into a replenishment tank. After filtering the solution and adding additives in the replenishment tank, the process solution is delivered to the solution tank. The process keeps the gas content in the process solution low. It should be noted that FIGS. 3 and 4 show the system only in a high level form without necessarily showing all the valves, pumps, and filtration arrangements that may be employed. Further, in system 100, instead of one degasser 108, multiple degassers may be used.

As shown in FIG. 4, another processing system 200 according to an embodiment of the present invention uses degassed process solution. The system 200 may comprise a solution tank 202 that is connected to a wet processing unit comprising a number of wet processing stations 204. In this embodiment, a degasser 208 is connected between the solution tank 202 and the processing stations 204. In operation, process solution 210 in the tank is delivered to the degasser through a first line 212 as a first solution flow 211A. The process solution is degassed in the degasser 208 and delivered to a second line 214 as a second solution flow 211B. The second line 214 delivers the second solution flow 211B of process solution, which is degassed, to the processing stations 204. The delivery may be performed through an intake manifold 216 connecting the line 214 to each processing station 204. The intake manifold 216 may include valves (not shown) to switch on and off the second solution flow 211B to each station. Used process solution from each station is received by a solution exit manifold 218 as a third solution flow 211 C and is delivered to a third line 220 for recycling. The third line 220 delivers the third flow 211C, which is the used solution, back to the solution tank to be replenished and degassed. Alternatively, the replenishment may be done in a replenishment tank (not shown). In this case, the third solution flow may be first delivered into a replenishment tank and then to the solution tank. After filtering the solution and adding additives in the replenishment tank, the process solution is delivered to the solution tank. It should be noted that, in system 200, instead of one degasser 208, multiple degassers may be used by connecting each to the lines of the manifold that are connected to the processing stations 204.

Systems described in FIG. 3 and FIG. 4 may include additional tanks and degassers. These additional features and variations are still within the scope of this invention. For example, the used solution from the processing unit may be first degassed and conditioned in a separate tank and delivered to another holding tank, which supplies the conditioned solution back to the processing unit. Alternately degassing may be performed within the processing stations 104 and 204 of FIGS. 3 and 4 instead of external to the stations. Degassing may even be performed in-situ within the process chamber during the process. For example, in an exemplary electrochemical deposition process or an exemplary electroless deposition process performed on an exemplary wafer, vacuum may be pulled over the deposition cell itself where the wafer is immersed in the process solution, and therefore degassing and de-bubbling are achieved in-situ. This method may be beneficially used, especially in electroless deposition techniques where generation of gas bubbles at the interface of growth is a common problem. In copper electroless plating for example, gas bubbles form on the substrate surface as a result of gasses in the plating solution, as well as a result of electroless deposition reactions taking place at this interface. Removal of such bubbles by in-situ degassing would greatly enhance the quality of electroless deposited copper layers.

Exemplary embodiments of degasser 108 and degasser 208 include passing the solution through an opening with semipermeable, porous walls. These walls do not pass much liquid but they pass through the gasses. Vacuum can be pulled outside the walls to increase the rate of degassing. One such degasser is provided by Celgard Incorporated of Charlotte, N.C. Flow capacities of degassers vary widely from a few ml/min to many gallons/min. Other degassing methods include, but are not limited to, ultrasonic or mega sonic techniques, which involve coupling ultrasonic and megasonic energy to the electrolyte. It should be noted that electrolytes may also be degassed by pulling vacuum on the surface of the electrolyte anywhere in its path. For example, the solution tank 102 in FIG. 3 and the tank 202 in FIG. 4 may be built in a vacuum tight manner and some degree of vacuum may be kept over the solution in these tanks. Replacing the normally existing atmospheric-pressure air/solution interface with a vacuum/solution interface would, in time, cause degassing of the solution. Similarly such vacuum/solution interfaces may be created anywhere in the solution delivery and re-cycling circuit. It should be noted that for efficient degassing the vacuum can be at a value that is less than the atmospheric value of 760 Torrs. For example the vacuum level may be in the range of 10-500 Torrs, typically in the 50-150 Torrs range. Within the enclosure where vacuum is pulled for degassing purposes, there may be a partial pressure of various gasses that are components of air (such as nitrogen, oxygen, carbon dioxide, etc.) or a specific gas may be slowly bled into this enclosure to control the composition of the gas. For example, as the vacuum is pulled on the enclosure, a small inlet may leak pure nitrogen into the enclosure. By using an appropriate pump the partial pressure in the enclosure can still be kept low even with the leak, however, in this case the composition of gas in the enclosure would be mostly nitrogen, and therefore less nitrogen would be pulled out of the solution into the enclosure. This way a certain amount of control would be possible of the gas species that are pulled out of the solution.

A certain amount of degassing may even be obtained by pressurizing the solution in a container, such as a section of a tube, with porous walls that allow passage of gasses but not liquids. This way the gasses in the solution diffuse out through the porous walls due to the pressure difference, and in time the solution gets degassed. Again, by controlling the chemical composition of the gaseous environment outside the porous walls, one can control the efficiency of taking certain species of gas out of the solution. Examples of porous tubes that have high permeability for gases are those made of Teflon AF 2400 supplied by DuPont Inc. This material has permeability of 49,000-280,000 centiBarrer (cB) for nitrogen, hydrogen, oxygen and carbon dioxide.

In an experiment, the dissolved oxygen content of 100 liters of sulfate-based copper plating electrolyte, which was used in an electroplating tool, was measured by a dissolved oxygen probe. After calibrating the probe in air to 100%, the dissolved oxygen content in the electrolyte was measured to be about 60%. After 3 hours of degassing the electrolyte with degasser, the probe reading went down to about 20%. After additional degassing reading went down even lower to about 10%. As can be seen from this data there has been over 80% reduction in the gas content of the electrolyte through this procedure. Whereas bubbles were seen over the pad structures placed into the first electrolyte, no bubbles were seen on pad structures after the electrolyte was degassed. It should be noted that although just the reduction in dissolved oxygen was measured and monitored in this example (since the probe was an oxygen probe), similar reduction in dissolved nitrogen and other gasses in the electrolyte is expected because of degassing. Selection of the type and porosity of the porous wall (also called filter) used in the degasser may improve or reduce removal rate of certain types of gases. For example, certain filter materials used in degassers efficiently remove carbon dioxide while others do not.

It should be noted that although the invention is described mostly in examples of electrochemical and electrochemical mechanical processes, it is also applicable in any wet process such as chemical processes and chemical mechanical processes. Chemical etching, like electrochemical polishing, is an attractive method to remove excess material, such as copper from workpiece surfaces such as semiconductor wafer surfaces. Use of degassed etchant solutions instead of the prior art solutions containing dissolved gasses avoids the formation of bubbles and defects that have been described previously. It should be noted that in material removal processes, bubbles formed on the surface of the layer to be removed, slow down or inhibit the removal of the section of the material right under these bubbles and thus cause defects. In electroless deposition techniques, which are employed to deposit electronic materials such as copper, nickel, palladium and their alloys, use of degassed electrolytes would avoid bubble formation on workpiece surfaces and avoid the formation of defects.

Referring back to FIGS. 3 and 4, a gas detector for example a dissolved oxygen probe or a carbon dioxide probe may be used with the systems 100 and 200. Other detection means such as optical, ultrasonic, mass spectroscopy, etc. may also be used to monitor the degassing process. Instead of monitoring the solution, the gas content of the vacuum environment of the degasser may also be monitored to provide information about the efficiency of removal of gasses from the solution.

The detector may be disposed in various locations in the systems 100 and 200. For example, in the system 100, the detector may be placed in the first line 112 to monitor gas such as oxygen or carbon dioxide or other gas species in the first solution flow 111A, or it may be placed in the second line 114 to monitor the possible residual gas in the second flow 111B. The results from the second flow may be used determine efficiency of the degassing process. Optionally, monitoring devices to detect dissolved gas may be placed in the processing stations 104 or 204 to monitor the gas in the process solution during metal plating or removal processes. An alarm system may also be part of the gas monitoring circuitry so that when excessive amount of dissolved gas is detected in the process solution, the alarm warns the operators or stop the process until the dissolved gas concentration is reduced to a safe operation threshold. Alternately, if the degassing process is efficient, it may be operational only intermittently to keep the dissolved gas content at a predetermined level. The dissolved gas sensor may be used to turn the degasser(s) on or off in this case, depending on the amount of dissolved gas in the electrolyte.

As indicated before, the principles of this invention may be used for degassing other type of process solutions used in the semiconductor IC manufacturing. A class of exemplary process solutions may be cleaning solutions used for cleaning of the patterned dielectric layers. Dissolved gas in such solutions reduces the cleaning efficiency by nucleating on the finely patterned structures to form microscopic bubbles on them. Presence of these microscopic or nano-size gas bubbles prevents effective cleaning of these locations, leading to defects in the subsequently deposited layers. For example, in manufacturing of copper damascene wiring structures or other wiring methods, a dry etch process such as reactive ion etching (RIE) may be used to etch dielectric layers to form features such as vias and trenches in the dielectric layers. The process also involves cleaning steps as will be described next.

Figure 5:
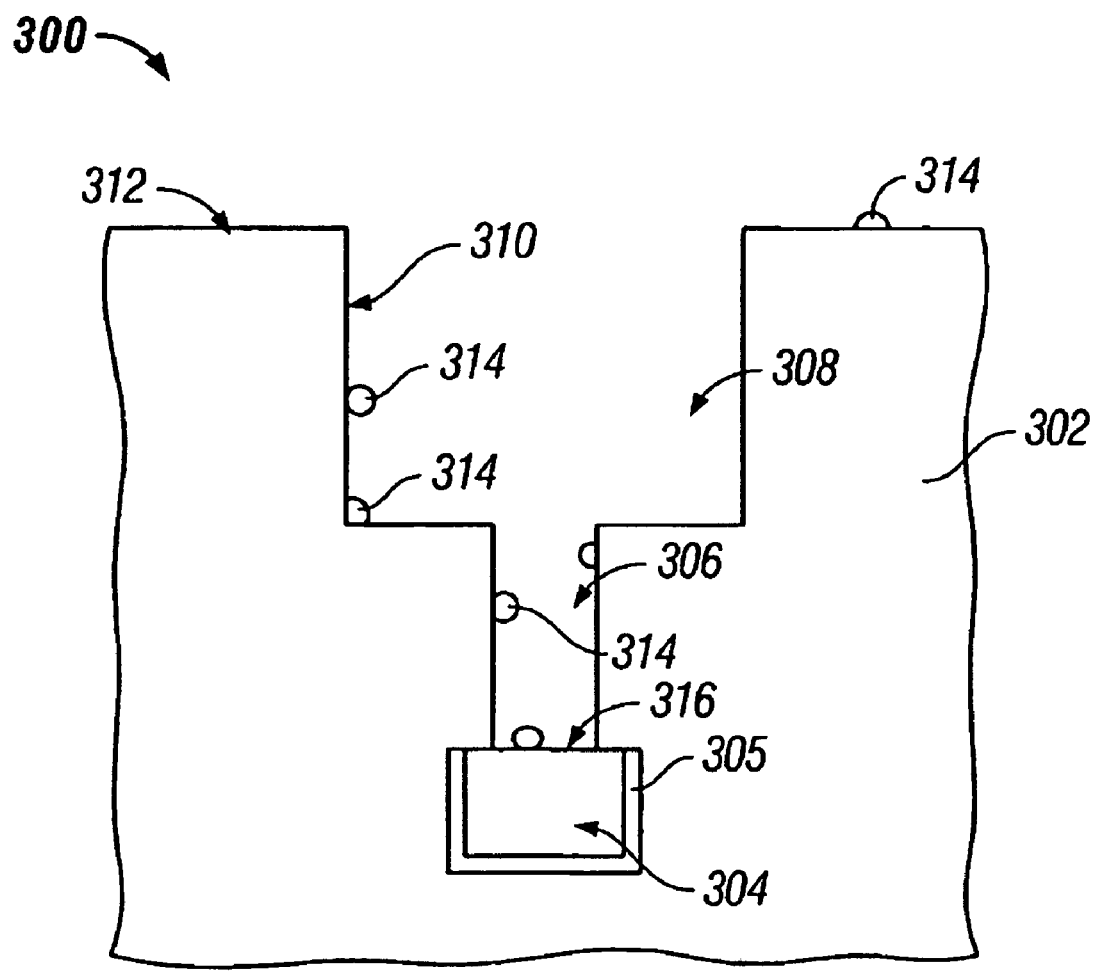
FIG. 5 is a schematic illustration of the possible locations of the bubbles created during the cleaning of a dual damascene structure formed in a dielectric layer.

FIG. 5 shows an exemplary structure 300, which is formed in a dielectric layer 302 by preferably a dry etch process. The structure 300 may be a dual damascene structure. The structure 300 can be connected to a metal line 304 by a narrow feature 306 such as a narrow trench or via. The metal line 304 is typically copper, lined by a barrier layer 305. The narrow feature 306 expands into a large feature 308 or trench. In a conventional process sequence, after forming the structure 300 the surface is generally lined with a barrier layer and then filled with copper to form an interconnect line to electrically connect to metal line 304. However, before the barrier layer formation, inner surfaces 310 and top surface 312 of the structure should be cleaned from the residues of the etchant species that are mostly organic residues, and other residues. This cleaning is mainly performed using cleaning solutions and solvents to clean off the residues from the surfaces. However, since such solutions are not degassed, bubbles 314 can nucleate on surface 316 of the metal line 304 and on the surfaces 310, 312. During cleaning, cleaning solution cannot effectively act upon and clean the residues from the surface spots that are covered or masked by the bubbles. Such unclean spots will lead to poor adhesion between the subsequently deposited film, often a barrier layer (not shown), and the surfaces 310, 312 and 316. Poor adhesion between the surface 316 and the barrier layer causes high contact resistance between the line 304 and the subsequently deposited copper. In order to avoid this, the cleaning solutions may be degassed before the cleaning. Systems which are similar to the systems 100 and 200, and the same degassing principles can be used for the degassing of the cleaning solutions and recycling of the used cleaning solutions.

A similar degassing approach can also be used for the cleaning solutions employed in cleaning substrates after etching metals on such substrates with corrosive gases. For example, this may be applied after etching aluminum using the chlorine gas. If the residues on the substrate are cleaned with degassed cleaning solutions, bubbles formation is minimized on the cleaned surfaces and the residues of the corrosive gases are effectively removed.

Although various preferred embodiments and the best mode have been described in detail above, those skilled in the art will readily appreciate that many modifications of the exemplary embodiment are possible without materially departing from the novel teachings and advantages of this invention.

What is claimed is:

1. A system for delivering a degassed process solution to at least one process unit for processing a layer on a workpiece, comprising:
   a holding tank for holding a process solution;
   a plurality of process units coupled to the holding tank configured to receive the process solution from the holding tank;
   a degasser coupled to the holding tank configured to receive the process solution from the holding tank without passing the process solution through the process units and provide the degassed process solution to the holding tank without passing the process solution through the process units; and
   a monitor unit coupled to the degasser and configured to maintain a dissolved gas content in the degassed process solution at or below a predetermined amount, and wherein the system further comprises a controller to separately control a flow of the process solution through the degasser from a flow of the process solution through the process units.

2. The system of claim 1, wherein the monitor unit is a dissolved gas meter.

3. The system of claim 1, wherein the process units recycle used process solution to the holding tank.

4. The system of claim 1, further comprising a pump coupled between the degasser and the holding tank for circulating the process solution.

5. The system of claim 1, wherein the process units comprise at least one selected from the group consisting of electrochemical process station, electrochemical mechanical process station, chemical process station and chemical mechanical process station.

6. The system of claim 1, wherein the at least one process unit comprises a cleaning station which uses the degassed process solution to clean the workpiece.

7. An apparatus for processing a surface of a workpiece using a degassed process solution, the apparatus comprising:
   a solution tank configured to hold a process solution, the solution tank including a first inlet, a first outlet, a second inlet, and a second outlet;
   multiple process stations coupled to the solution tank configured to receive the process solution from the first outlet of the solution tank for processing the surface of the workpiece; and
   a degasser coupled to the solution tank configured to degas the process solution, the degasser being configured to receive the process solution from the second outlet of the solution tank without passing the process solution through the process stations, and return the process solution to the second inlet of the solution tank without passing the process solution through the process stations,
   wherein the apparatus further comprises a controller to separately control a flow of the process solution through the degasser from a flow of the process solution through the process stations, and to control the flow through the degasser based on a monitored gas content of the process solution.

8. The apparatus of claim 7, further comprising a monitor unit coupled to the degasser and configured to maintain a dissolve gas content in the degassed process solution at or below a predetermined amount.

9. The apparatus of claim 7, wherein the multiple process stations are configured to return the process solution to the first inlet of the solution tank.

10. The apparatus of claim 7, wherein the multiple process stations comprise at least one selected from the group consisting of electrochemical process station, electrochemical mechanical process station, chemical process station and chemical mechanical process station.

* * * * *